United States Patent
Hu et al.

(10) Patent No.: US 11,657,891 B2
(45) Date of Patent: *May 23, 2023

(54) ERROR RECOVERY OPERATIONS

(71) Applicant: Micron Technology, Inc., Boise, ID (US)

(72) Inventors: Guang Hu, Mountain View, CA (US); Ting Luo, Santa Clara, CA (US); Chun Sum Yueng, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/743,989

(22) Filed: May 13, 2022

(65) Prior Publication Data
US 2022/0270702 A1    Aug. 25, 2022

Related U.S. Application Data

(63) Continuation of application No. 17/122,864, filed on Dec. 15, 2020, now Pat. No. 11,335,429.

(51) Int. Cl.
*G11C 29/42* (2006.01)
*G11C 7/20* (2006.01)
*G11C 29/44* (2006.01)

(52) U.S. Cl.
CPC .............. *G11C 29/42* (2013.01); *G11C 7/20* (2013.01); *G11C 29/44* (2013.01)

(58) Field of Classification Search
CPC .................................. G11C 29/42; G11C 7/20
See application file for complete search history.

(56) References Cited

U.S. PATENT DOCUMENTS

| 11,335,429 B1* | 5/2022 | Hu ..................... G11C 29/52 |
| 2014/0231954 A1 | 8/2014 | Lue |
| 2015/0019922 A1 | 1/2015 | Leem et al. |

(Continued)

FOREIGN PATENT DOCUMENTS

WO    2017074570 A1    5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Tuan T Nguyen
(74) *Attorney, Agent, or Firm* — Brooks, Cameron & Huebsch, PLLC

(57) ABSTRACT

A method includes determining whether a data reliability parameter associated with a set of memory cells is greater than a threshold data reliability parameter and in response to determining that the data reliability parameter is greater than the threshold data reliability parameter, performing an error recovery operation. The method further includes, subsequent to performing the error recovery operation, determining whether the data reliability parameter associated with the set of memory cells is less than the threshold data reliability parameter and in response to determining that the data reliability parameter is less than the threshold data reliability parameter, setting an offset associated with the error recovery operation as a default read voltage for the set of memory cells.

20 Claims, 5 Drawing Sheets

(56) References Cited

U.S. PATENT DOCUMENTS

| | | |
|---|---|---|
| 2015/0363264 A1 | 12/2015 | Cai et al. |
| 2016/0179386 A1 | 6/2016 | Zhang |
| 2018/0107540 A1 | 4/2018 | Lee |
| 2018/0261296 A1* | 9/2018 | Choi ................... G11C 16/28 |
| 2020/0135279 A1 | 4/2020 | Singidi et al. |
| 2020/0301768 A1 | 9/2020 | Papandreou et al. |
| 2020/0395082 A1* | 12/2020 | Vishwanath ........... G11C 29/52 |
| 2021/0191807 A1* | 6/2021 | Yeung .................. G06F 11/076 |

* cited by examiner

ERROR RECOVERY OPERATIONS

PRIORITY INFORMATION

This application is a Continuation of U.S. application Ser. No. 17/122,864, filed Dec. 15, 2020, the contents of which are included herein by reference.

TECHNICAL FIELD

Embodiments of the disclosure relate generally to memory sub-systems, and more specifically, relate to error recovery operations within a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
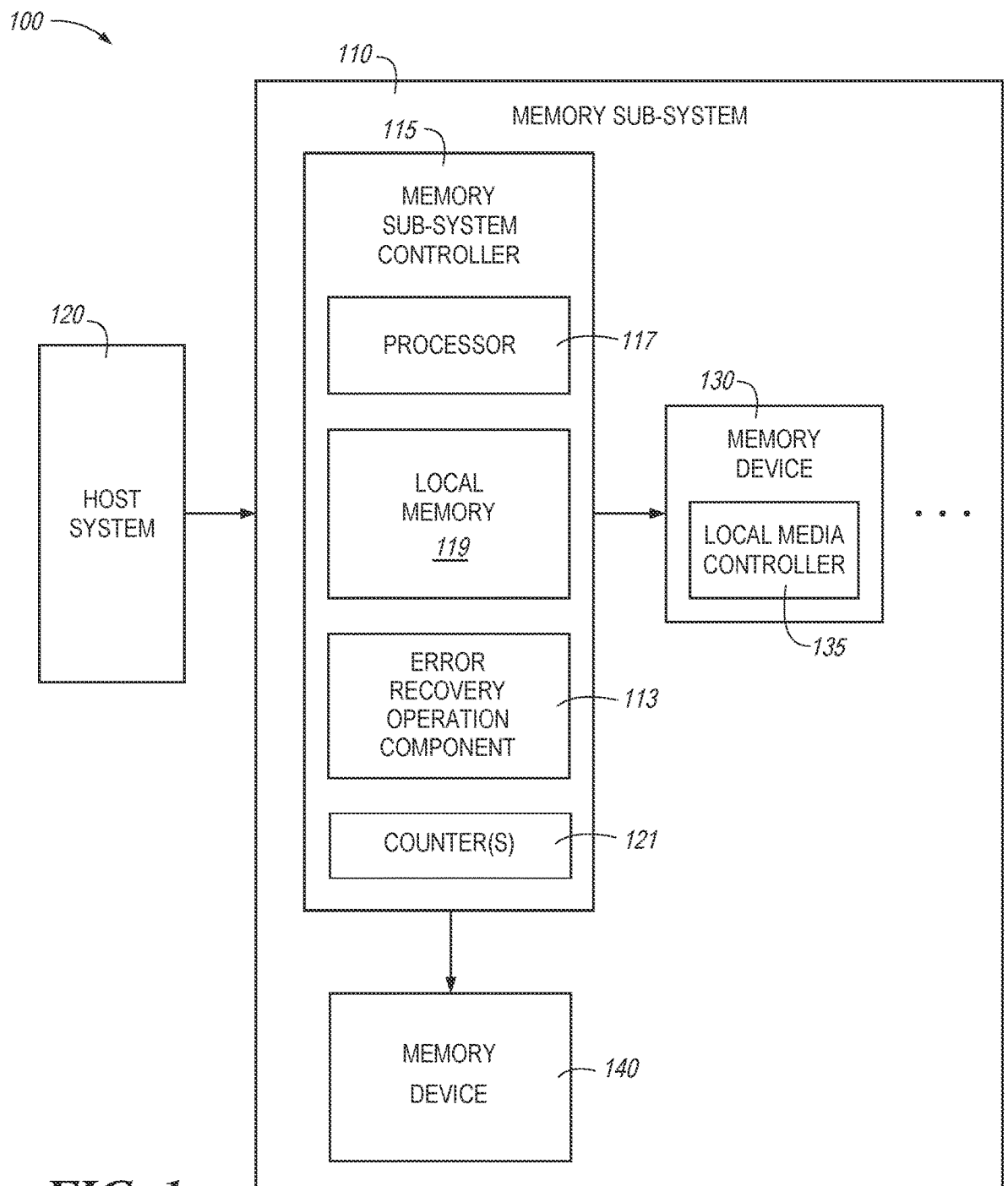
FIG. 1 illustrates an example computing system that includes a memory sub-system in accordance with some embodiments of the present disclosure.

Aspects of the present disclosure are directed to error recovery operations in a memory sub-system, in particular to memory sub-systems that include an error recovery operation component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

During operation, a memory sub-system can incur errors that can affect the quality and/or accuracy of data written to and stored by the memory sub-system. Such errors can include loss or gain of charge associated with a storage cell, read disturbances, write disturbances, and/or degradation of data quality/cell quality as a result of the quantity of program/erase cycles the cell has been subjected to. As the memory sub-system ages, such errors can become increasingly difficult to correct and/or mitigate, especially in mobile computing system architectures in which an amount of physical space available for hardware components can be limited. In addition, these errors can become more pronounced and/or more frequent over time (e.g., as the memory sub-system ages), which can further impact the quality and/or accuracy of data written to and stored by the memory sub-system. Moreover, such errors can become more difficult to mitigate and/or correct at edge cases, such as when the memory sub-system is experiencing a stress condition, such as various end-of-life (EOL) testing operations where the memory sub-system is exposed to frequent and/or rigorous testing to ensure that the memory sub-system can operate.

Some approaches attempt to mitigate the types of errors described above by performing a series (or at least a portion of a series) of error handling processing (e.g., read error handling (REH) processes) to correct such errors and/or determine if correction of such errors was successful. Such approaches can perform different operations in succession as part of performing the series of error handling processes to determine which, if any of such operations can remedy the detected errors. As an example, some approaches can attempt to read a memory cell with various retry voltage offsets. If these retry voltage offsets are unsuccessful, a read calibration operation can be performed to check if the data can be read. If this is unsuccessful, some approaches can perform a soft decode operation (e.g., a low-density parity-check (LDPC) soft decode operation) to read the data. If this is unsuccessful, a parity-based operation (e.g., a redundant array of independent NAND (RAIN) operation) can be performed to attempt to recover the data.

However, in some approaches, the series of error handling processes can include upwards of ten (10) distinct operations and can therefore be expensive in terms of both time and computing resources to perform. Further, there is no guarantee that the data will be successfully read or recovered even after the error handling processes are performed. In addition, successful performance of one of the error handling processes may not lead to an optimized read level and can instead lead to a read level that is "good enough" to pass one or more operations of the error handling process but still may not be optimized. This can lead to a decrease in performance of the memory sub-system, especially at corner cases such as EOL testing of memory sub-systems that are deployed in mobile computing architectures.

For example, in approaches that employ a "sticky read" operation as one or more of the error handling processes, one operation of the error handling process can continuously recover a failure multiple times, which can lead to a default read voltage being set based on the sticky read voltage. In some approaches, this default read voltage can be adequate (e.g., if a single read recovery is invoked and/or if the read offset default that is set has a low enough raw bit error rate (RBER)) for performance of subsequent read operations, however, such default read voltages may not be optimized. As used herein, a "sticky read" operation generally refers to a read operation that is performed using a particular parameter (e.g., a particular threshold voltage, a particular read offset applied to a default threshold voltage, etc.), when the particular parameter is used for multiple consecutive read operations and the particular parameter is different from a default parameter (e.g., a default read setting, a calibrated read setting, etc.) associated with the memory sub-system. A "sticky read mode" generally refers to a mode of operation of the memory sub-system during which read operations are performed using a particular parameter when the particular parameter is used for multiple consecutive read operations and the particular parameter is different from a default parameter or a calibrated parameter associated with the memory sub-system. Further details regarding a particular parameter, a threshold voltage, a read offset, a default parameter, a default read setting, a calibrated read setting, etc. are described herein.

Although use of a sticky read voltage for performance of subsequent read operations can provide adequate read accuracy in some approaches, reliance on a sticky read voltage for performance of read operations in a memory sub-system is generally not adequate in corner cases such as during the EOL of a memory sub-system and/or in mobile computing architectures. For example, while setting the read offset to a particular value (e.g., the sticky read voltage) can allow for data recovery during one or more stages of the error handling processes, the read offset voltage may not be a most optimized read level (e.g., may not be a valley of the VT distribution). In some approaches, such read offset voltage levels can allow for a hard decode stage of the error handling process to pass, but can lead to scenarios in which the RBER associated with the memory cells from which the data is read to be higher than optimal. This can lead to a decrease in LDPC throughput, which can, in turn, affect the VT distribution such that the decrease in the LDPC throughput is continuously low for subsequent reads, thereby negatively impacting the performance of the memory sub-system.

Aspects of the present disclosure address the above and other deficiencies by determining an optimized read offset voltage (e.g., an optimized offset for a sticky read voltage) by analyzing various data reliability parameters prior to and/or during setting a particular read offset voltage (e.g., before and/or during setting a sticky read voltage) as a default read voltage for a memory cell or set of memory cells. One such data reliability parameter is a raw bit error rate (RBER) associated with the memory sub-system or components of the memory sub-system. In some embodiments, the RBER can be indicative of performance and/or a health of the memory sub-system or components of the memory sub-system. As will be appreciated, the RBER of a memory sub-system, memory device, memory array, etc. is generally quantified as the number of corrupted bits (e.g., bits in error) per number of total bits read (including correctable as well as uncorrectable errors). Multiple factors, such as temperature, wear-out from program erase cycles (PEC); physical age, (e.g., the number of months a device has been in the field, independent of PEC); workload, which can be measured by a quantity of read, write, and/or erase operations, because such operations to, for example, a page, can potentially disturb surrounding cells; and the presence of other errors in the memory sub-system can affect the RBER of a memory sub-system. In some embodiments, the RBER can be determined after successful decoding of data stored by a memory sub-system.

For example, aspects of the present disclosure can allow for comparisons of a particular read offset voltage, such as a sticky read voltage, and data reliability parameters, such as a RBER associated with a memory cell or set of memory cells to determine whether a read offset voltage is optimized. Upon determination that the read offset voltage is not optimized, aspects of the present disclosure can allow for performance of particular operations, such as an auto read calibration (ARC) operation, to be performed (or re-performed) to optimize the read offset voltage. As used herein, an "auto read calibration operation" generally refers to an operation to determine an optimized read voltage in which multiple reads of a same cell are performed at differing voltage levels and the quantity of flipped bits (e.g., the quantity of bits that change from zero to one, or vice versa) between each read level are determined. Based on the quantity of flipped bit between the multiple reads, it can be possible for the memory sub-system to automatically calibrate an optimized read voltage associated with locations in which the read data is stored.

As described in more detail, herein, aspects of the present disclosure can include monitoring whether a determined RBER is greater than or less than a RBER associated with performance of a sticky read operation. In some embodiments, the RBER associated with performance of the sticky read operation can be based on LDPC throughput data, as described below. If the RBER is greater than the RBER associated with performance of the sticky read operation, it may be concluded that the current read offset is not optimized. In this case, embodiments herein allow for performance of at least one ARC operation on memory cells (e.g., a page of memory cells) involved in the read operation to move the read level to valley of $V_T$ distribution. In some embodiments, the ARC offset can then be set as the default read voltage for the set of memory cells.

In addition, embodiments herein allow for a counter (e.g., a hardware device that can store an incrementable number) to track the efficiency of a sticky read ARC efficiency check. For example, if, after an ARC operation is performed and a determined RBER for the memory cells is still greater than the RBER corresponding to use of the sticky read voltage, then the counter can be incremented. If it is determined that the counter has surpassed some threshold count value, in some embodiments performance of ARC operations can be disabled for the set of read memory cells.

By performing the operations described herein, memory sub-system performance can be improved in comparison to the approaches described above in which read offset voltages may not be fully optimized, especially in corner cases, such as when the memory sub-system is in an EOL state and a comparatively large quantity of sets of memory cells exhibit high valleys with respect to offset voltages set during the performance of error handling processes. For example, by performing the operations described herein, memory sub-system performance can be increased even at the EOL of the memory sub-system by comparing the RBER of sets of memory cells to read voltage values determined through sticky read operations and/or ARC operations to optimize read voltages applied to sets of memory cells within the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include an error recovery operation component 113. Although not shown in FIG. 1 so as to not obfuscate the drawings, the error recovery operation component 113 can include various circuitry to facilitate performance of error recovery operations to optimize read voltages for a memory sub-system, especially in corner cases, such EOL testing operations, as described herein. In some embodiments, the error recovery operation component 113 can include special purpose circuitry in the form of an ASIC, FPGA, state machine, and/or other logic circuitry that can allow the error recovery operation component 113 to orchestrate and/or perform operations described herein involving the memory device 130 and/or the memory device 140.

In some embodiments, the memory sub-system controller 115 includes at least a portion of the error recovery operation component 113. For example, the memory sub-system controller 115 can include a processor 117 (processing device) configured to execute instructions stored in local memory 119 for performing the operations described herein. In some embodiments, the error recovery operation component 113 is part of the host system 110, an application, or an operating system.

In a non-limiting example, an apparatus (e.g., the computing system 100) can include an error recovery operation component 113. The error recovery operation component 113 can be resident on the memory sub-system 110. As used herein, the term "resident on" refers to something that is physically located on a particular component. For example, the error recovery operation component 113 being "resident on" the memory sub-system 110 refers to a condition in which the hardware circuitry that comprises the error recovery operation component 113 is physically located on the memory sub-system 110. The term "resident on" can be used interchangeably with other terms such as "deployed on" or "located on," herein.

Figure 2:
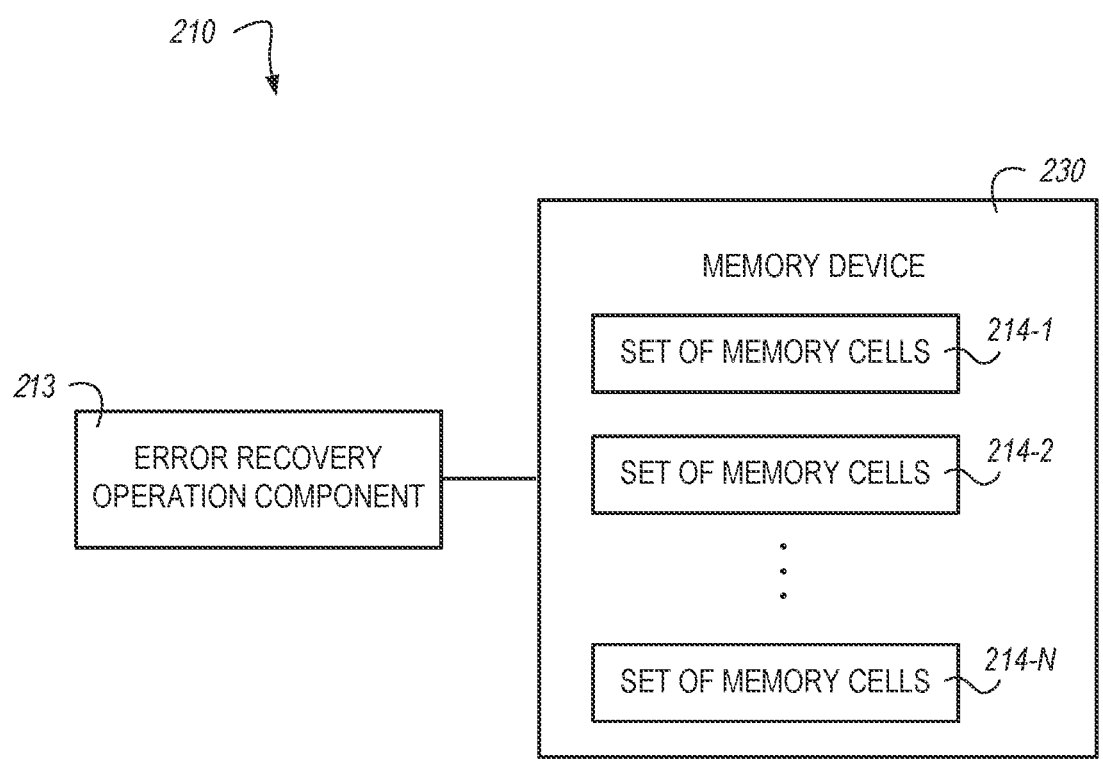
FIG. 2 illustrates an example memory sub-system in accordance with some embodiments of the present disclosure.

The error recovery operation component 113 can be coupled to a set of memory cells (e.g., one or more of the sets of memory cells 214-1 to 214-N illustrated in FIG. 2, herein). In some embodiments, the error recovery operation component 113 can determine whether a data reliability parameter associated with the set of memory cells is greater than a threshold data reliability parameter value. The error recovery operation component 113 can perform an error recovery operation in response to the determination that the data reliability parameter value is greater than the threshold data reliability parameter value. As used herein, a "data reliability parameter" generally refers to a quantifiable value that corresponds to the accuracy of data stored by or retrieved from the memory sub-system 110. One example of a data reliability parameter is a raw bit error rate (RBER), which is described in more detail, herein.

Continuing with this example, the error recovery operation component 113 can determine, subsequent to performing the error recovery operation, whether the data reliability parameter value associated with the set of memory cells is less than the threshold data reliability parameter value and/or set an offset associated with performance of the error recovery operation as a default read voltage for the set of memory cells in response to the determination that the data reliability parameter value is less than the threshold data reliability parameter value. In some embodiments, the "threshold data reliability parameter" is a quantifiable value associated with a data reliability parameter that corresponds to a condition in which a quality or accuracy of stored or read data is likely to be in error. In at least one embodiment, the threshold data reliability parameter can be a sticky read voltage value that can correspond to a non-optimized default read voltage level.

In some embodiments, the data reliability parameter value can correspond to a raw bit error rate (RBER) associated with the set of memory and/or the threshold data reliability parameter value can correspond to a threshold RBER associated with the set of memory cells. Further, the threshold data reliability parameter value can be based, at least in part on a determined low-density parity-check (LDPC) throughput associated with the set of memory cells. As described in more detail, herein, the set of memory cells and the error recovery operation component can be housed within a memory sub-system that is resident on a mobile computing device. In some embodiments, the error recovery operation component 113 can cause performance of an auto read calibration (ARC) operation as part of performing the error recovery operation.

A counter 121 can be coupled to the error recovery operation component 113 and the error recovery operation component 113 can determine, subsequent to performance of the error recovery operation, whether the health characteristic value associated with the set of memory cells is greater than the threshold health characteristic value and increment the counter 121 in response to the determination. In some embodiments, the error recovery operation component 113 determine whether the counter 121 stores a count value that is greater than a threshold count value associated with the threshold data reliability parameter value and disable performance of the error recovery operation in response to the counter 121 storing the count value that is greater than the threshold count value.

In another non-limiting example, a system (e.g., the computing system 100) can include a memory device (e.g., the memory device 130) that can include multiple NAND memory cells (e.g., the set(s) of memory cells 214-1 to 214-N illustrated in FIG. 2, herein). The system can be a mobile computing device. A processing device (e.g., the error recovery operation component 113) can be coupled to the memory device. Continuing with this example, the processing device can perform operations that include monitoring data reliability parameters of respective sets of the NAND memory cells and determining whether a data reliability parameter associated with a respective set of memory cells is greater than a threshold data reliability parameter. The processing device can further perform operations that include performing an error recovery operation in response to the determination that the data reliability parameter associated with the respective set of the NAND memory cells is greater than the data reliability parameter value and determining, subsequent to performing the error recovery operation, whether the data reliability parameter associated with the respective set of the NAND memory cells is less than the threshold data reliability parameter. In some embodiments, the processing device can perform operations that further include setting an offset associated with performance of the error recovery operation as a default read voltage for the respective set of the NAND memory cells in response to the determination that the data reliability parameter is less than the threshold data reliability parameter.

Continuing with this example, in some embodiments, the processing device can perform operations including determining a raw bit error rate (RBER) associated with the respective set of the NAND memory cells as part of determining the data reliability parameter for the respective set of the NAND memory cells. As described in more detail herein, the threshold data reliability parameter can correspond to a threshold raw bit error rate (RBER) associated with the respective set of the NAND memory cells and/or the threshold data reliability parameter can be based, at least in part, on a determined low-density parity-check throughput associated with the respective set of the NAND memory cells.

The system can further include a counter (e.g., the counter 121) that can be coupled to the processing device. In some embodiments, the processing device can perform operations including determining, subsequent to performance of the error recovery operation, whether the data reliability parameter associated with the set of the NAND memory cells is greater than the threshold data reliability parameter and incrementing the counter in response to the determination. Continuing with the example, the processing device can further perform operations including determining whether the counter stores a count value that is greater than a threshold count value associated with the threshold data reliability parameter and disabling performance of the error recovery operation in response to the counter storing the count value that is greater than the threshold count value.

FIG. 2 illustrates an example memory sub-system 210 in accordance with some embodiments of the present disclosure. As shown in FIG. 2, the memory sub-system 210 can include an error recovery operation component 213, which can be analogous to the error recovery operation component 113 illustrated in FIG. 1 and a memory device 230, which can be analogous to the memory device 130 illustrated in FIG. 1. The memory device 230 can include sets of memory cells 214-1 to 214-N. The sets of memory cells 214-1 to 214-N can be blocks, pages, or other groups of memory cells within the memory device 230. The sets of memory cells 214-1 to 214-N can be NAND memory cells, although embodiments are not so limited. In some embodiments, the memory sub-system 210 can be resident on a mobile computing device such as a smartphone, laptop, phablet, Internet-of-Things device, autonomous vehicle, or the like.

The error recovery operation component 213 can determine whether the memory sub-system 210 is experiencing a stress condition. As used herein, a "stress condition" generally refers to a situation in which performance of the memory sub-system 210 is degraded due to one or more factors. Examples of factors that can lead to a stress condition can include an age of the memory sub-system 210 (e.g., as the memory sub-system 210 nears the end of its life, performance of the memory sub-system 210 can be reduced), whether the memory sub-system 210 is being subjected to cross-temperature (e.g., X-Temp) handling and/or testing.

The error recovery operation component 213 can cause a sticky read mode to be enabled for the memory sub-system 210. Once the sticky read mode is enabled for the memory sub-system 210, error recovery operations (e.g., read error handling operations) for the memory sub-system 210 can be performed based on a sticky read voltage that has been previously determined. As described above, sticky read mode refers to a mode of operation of the memory sub-system 210 during which read operations are performed using a particular parameter that is used for multiple consecutive read operations and the particular parameter is different from a default parameter or a calibrated parameter associated with the memory sub-system 210.

The error recovery operation component 213 can then determine an RBER for a previous read from a set of memory cells 214-1 to 214-N and compare the RBER for the previous read of the memory cells 214-1 to 214-N to an RBER that is calculated based on a read of the same set of memory cells 214-1 to 214-N using the sticky read voltage. As described in more detail in connection with FIG. 3, below, the error recovery operation component 213 can compare the RBER from the previous read of the set of memory cells 214-1 to 214-N to the calculated RBER using the sticky read voltage to determine if the RBER from the previous read of the set of memory cells 214-1 to 214-N is greater than, equal to, or less than the RBER calculated from the read of the set of memory cells 214-1 to 214-N using the sticky read voltage.

Based on the determination as to whether the RBER from the previous read (e.g., the RBER calculated during application of a particular read voltage) of the set of memory cells 214-1 to 214-N is greater than, equal to, or less than the RBER calculated based on the read voltage applied to the set of memory cells 214-1 to 214-N using the sticky read voltage, the error recovery operation component 213 can perform and/or cause performance of various operations described herein to optimize the read voltage level for the set of memory cells 214-1 to 214-N. Further, as described herein, optimization of the read voltage for the set of memory cells 214-1 to 214-N can be especially useful when the memory sub-system 210 is experiencing a stress condition.

In some embodiments, the sticky read voltage can be based on a determined LDPC throughput. As used herein, an "LDPC throughput" generally refers to an amount of data that is successfully decoded over a given time period, energy consumption, thermal dissipation, etc. A non-limiting example of the LDPC throughput is a quantity of data measured in megabytes per second (MB/s) decoded according to an LDPC decoding scheme at a given clocking frequency measured in megahertz (MHz), although examples are not so limited. In some embodiments, the LDPC throughput can be a Lambeau LDPC throughput, although examples are not so limited. In at least one embodiment, the LDPC throughput corresponds to a condition in which the LDPC throughput rate begins to decrease after staying at a relatively constant or consistent value.

Figure 3:
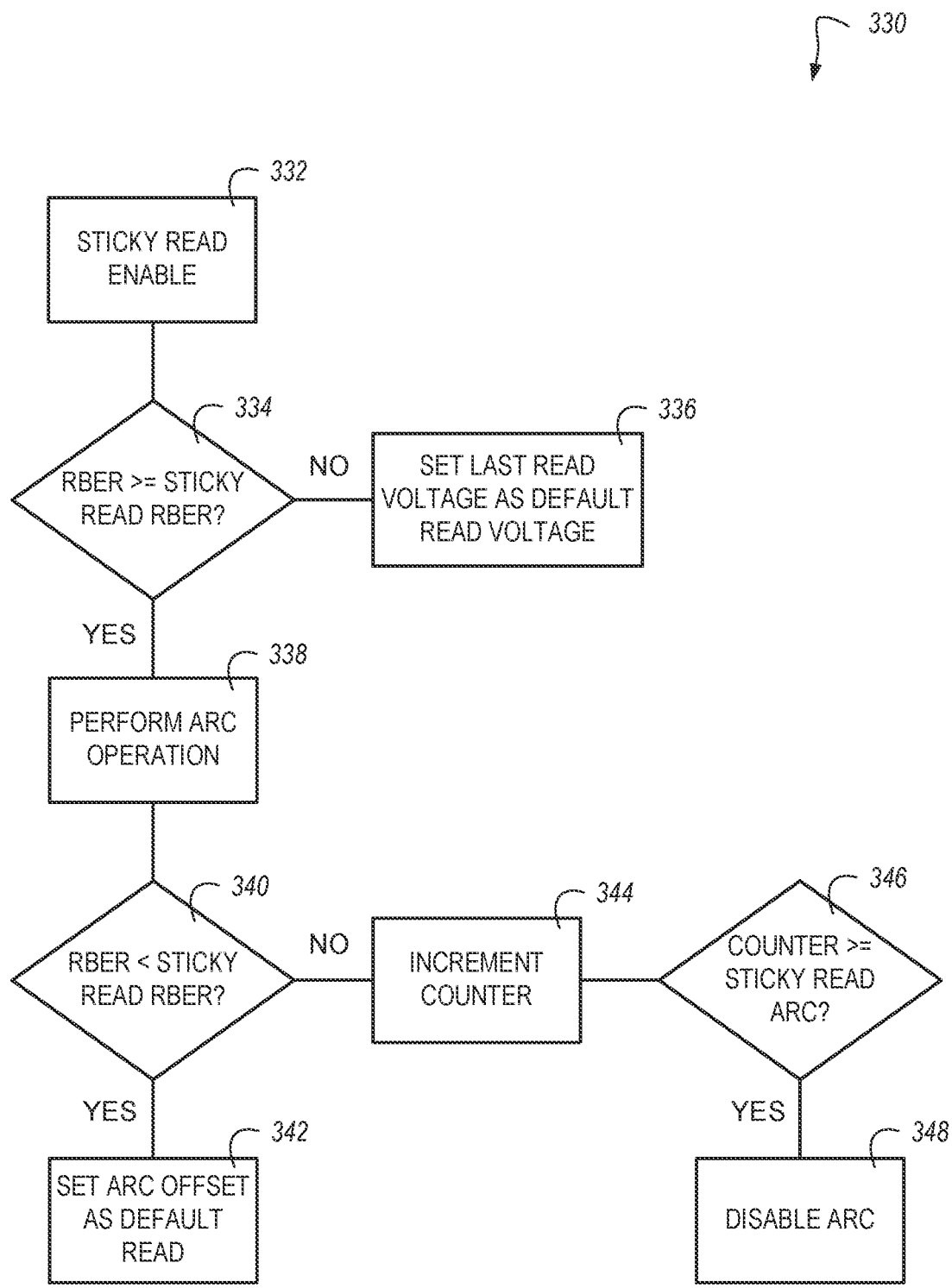
FIG. 3 is a flow diagram corresponding to error recovery operations in accordance with some embodiments of the present disclosure.

FIG. 3 is a flow diagram 330 corresponding to error recovery operations in accordance with some embodiments of the present disclosure. The process flow 330 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the process flow 330 is performed by the error recovery operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 332, a sticky read mode can be enabled for a memory sub-system (e.g., the memory sub-system 110/210 illustrated in FIG. 1 and FIG. 2, herein). At operation 334, a determination can be made as to whether a determined RBER corresponding to an applied voltage for a previous read for a set of memory cells (e.g., the sets of memory cells 214-1 to 214-N illustrated in FIG. 2) is greater than or equal to a RBER corresponding to a read of the set of memory cells using the sticky read voltage. In some embodiments, the determination can be made by an error recovery operation component (e.g., the error recovery operation component 113/213 illustrated in FIG. 1 and FIG. 2, herein). In response to a determination that the RBER determined for the previous read of the memory cells is less than the determined RBER corresponding to the read of the set of memory cells using the sticky read voltage, at operation 336, the default read voltage for the set of memory cells can be set to the voltage applied during the previous read of the set of memory cells.

If it is determined that the RBER determined for the previous read of the memory cells is greater than or equal to the determined RBER corresponding to the read of the set of memory cells using the sticky read voltage, at operation 338 an auto read calibration (ARC) operation can be performed involving the set of memory cells. As mentioned above, an ARC operation can seek to fine-tune the read voltage level to optimize the read voltage level for current and/or future accesses involving the set of memory cells.

After performance of the ARC operation, at operation 340, a determination can be made as to whether the RBER determined for the previous read of the memory cells is less than the determined RBER corresponding to the read of the set of memory cells using the sticky read voltage. If the RBER determined for the previous read of the memory cells is less than the determined RBER corresponding to the read of the set of memory cells using the sticky read voltage, the read voltage used during performance of the ARC operation can be set as the default read voltage.

However, if, at operation 340 it is determined that the RBER corresponding to the previous read of the memory cells is greater than or equal to the determined RBER corresponding to the read of the set of memory cells using the sticky read voltage, a counter (e.g., the counter 121 illustrated in FIG. 1) can be incremented. After the counter is incremented, a determination can be made at operation 346 as to whether a value stored by the counter is greater than or equal to a quantity of performed ARC operations (which is a measure of the efficiency of performance of ARC operations) and/or whether the value stored by the counter is greater than a value assigned to a sticky read voltage used in performance of one or more ARC operations. If the value stored by the counter exceeds the quantity of performed ARC operations (e.g., the efficiency of performing ARC operations) and/or is greater than the value assigned to the sticky read voltage used in performance of one or more ARC operations, at operation 348, performance of ARC operations involving the set of memory cells can be disabled.

In some embodiments, the quantity of ARC operations performed can correspond to the efficiency gained in performing ARC operations. In such embodiments, when the counter is incremented in response to performance of an ARC operation, a threshold voltage associated with performance of the ARC operation can be used for a subsequent read try. In some scenarios, this adjusted threshold read voltage can reduce RBER and/or improve LDPC throughput. If, however, after performance of a read operation using the threshold voltage associated with the ARC operation, the RBER corresponding to the previous read of the memory cells is greater than or equal to the determined RBER corresponding to the read of the set of memory cells using the sticky read voltage, subsequent ARC operations can be disabled because performance of ARC operations may not improve the threshold read voltage.

Figure 4:
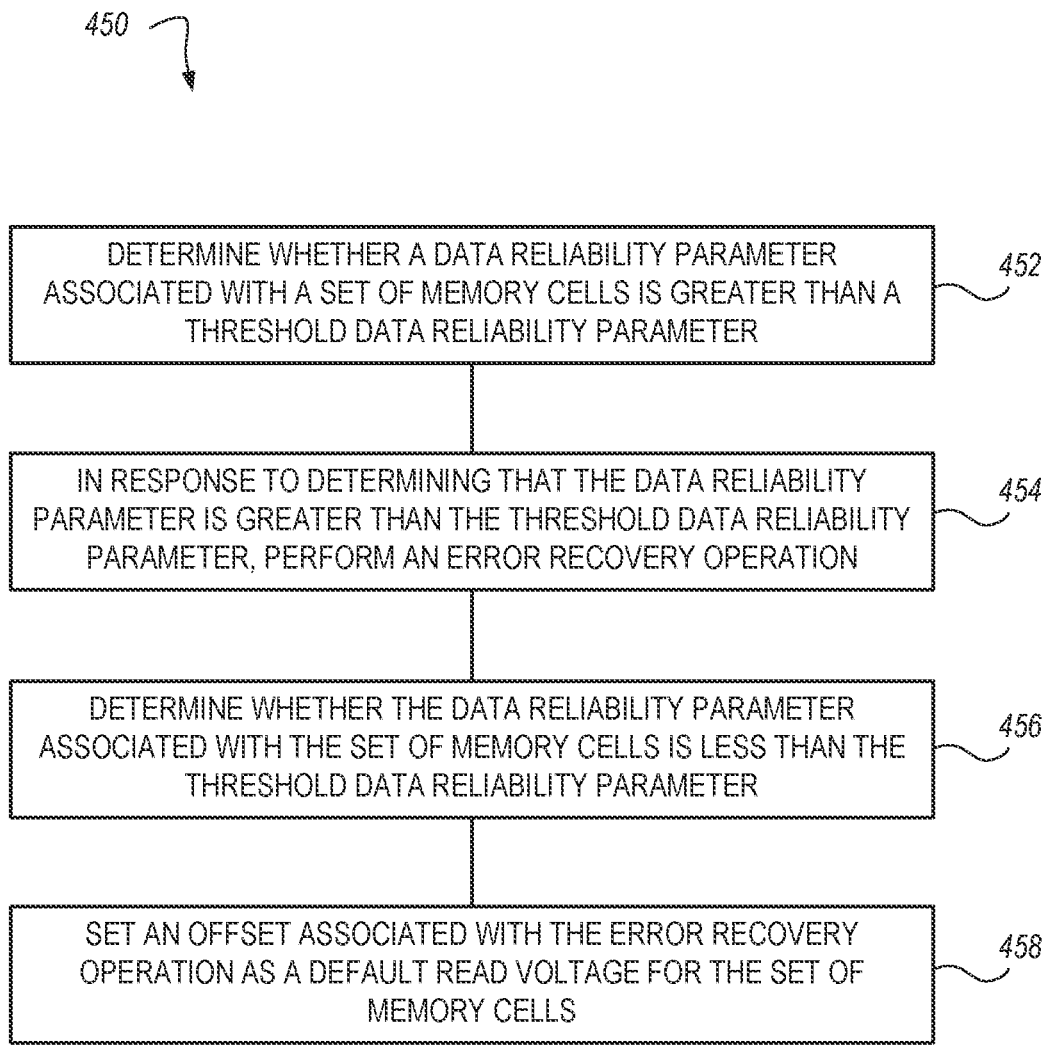
FIG. 4 is a flow diagram corresponding to a method for error recovery operations in accordance with some embodiments of the present disclosure.

FIG. 4 is flow diagram corresponding to a method 450 for error recovery operations in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the error recovery operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452, it is determined whether a data reliability parameter associated with a set of memory cells is greater than a threshold data reliability parameter. In some embodiments, the data reliability parameter for the set of memory cells can be determined by determining a raw bit error rate (RBER) associated with the set of memory cells and/or the threshold data reliability parameter can be determined by determining a threshold RBER associated with the set of memory cells.

At operation 454, an error recovery operation is performed in response to determining that the data reliability parameter is greater than the threshold data reliability parameter. In some embodiments, an auto read calibration (ARC) operation is performed as part of performing the error recovery operation.

At operation 456, it is determined whether the data reliability parameter associated with the set of memory cells is less than the threshold data reliability parameter. In some embodiments, it is determined whether the data reliability parameter associated with the set of memory cells is less than the threshold data reliability parameter subsequent to performing the error recovery operation.

At operation 458, an offset associated with the error recovery operation as a default read voltage for the set of memory cells is set in response to determining that the data reliability parameter is less than the threshold data reliability parameter. In some embodiments, one or more of the operations performed as part of the method 450 are performed by circuitry that is resident on a mobile computing device.

In some embodiments, the method 450 can include determining whether the data reliability parameter associated with the set of memory cells is greater than the threshold data reliability parameter subsequent to performing the error recovery operation and incrementing a counter (e.g., the counter 121 illustrated in FIG. 1, herein) corresponding to performing the error recovery operation. The method 450 can further include determining whether the counter stores a count value that is greater than a threshold count value associated with the threshold data reliability parameter and disabling performance of the error recovery operation.

Figure 5:
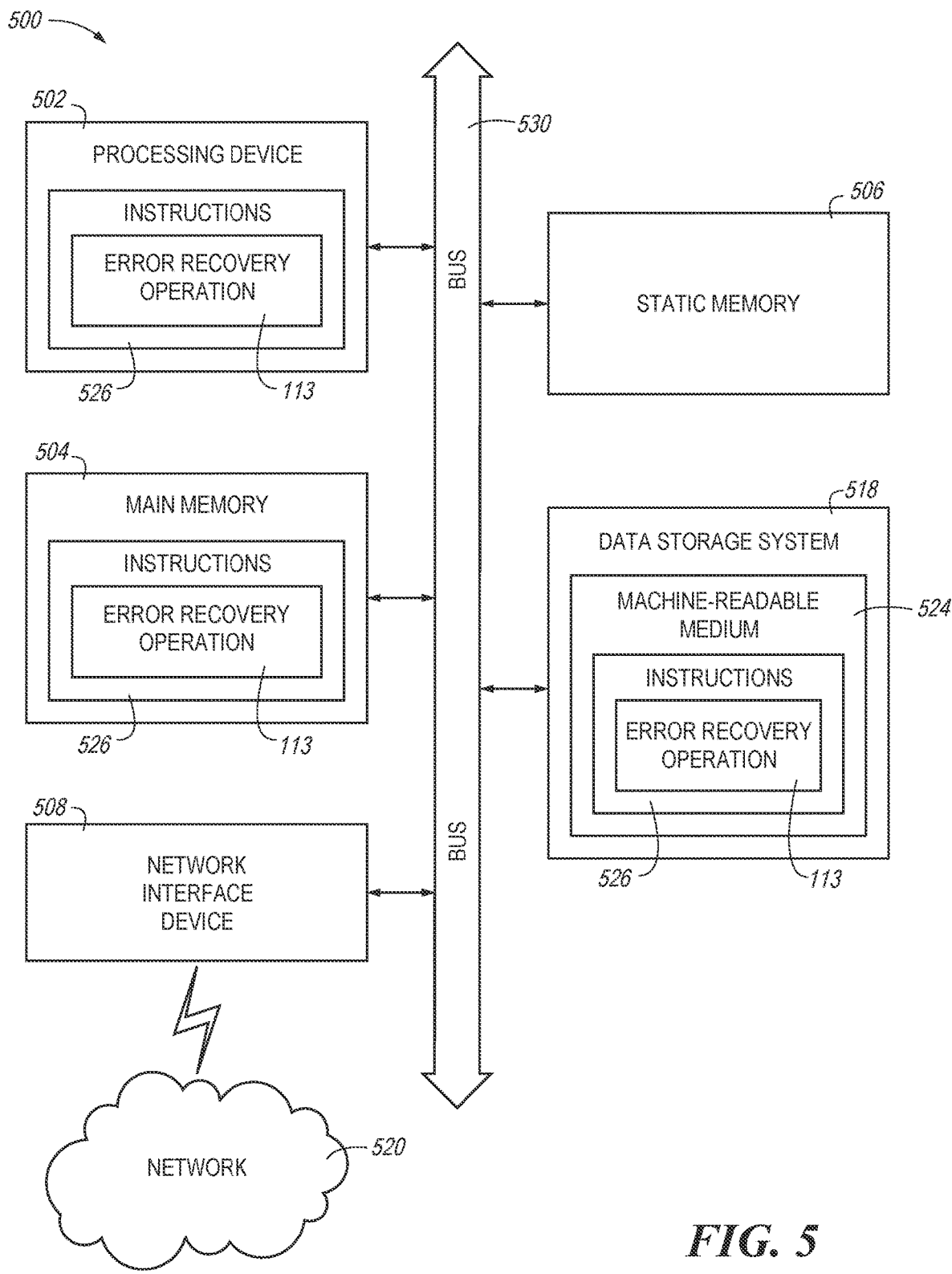
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the error recovery operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an error recovery operation component (e.g., the error recovery operation component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
performing an error recovery operation involving a set of memory cells;
subsequent to performing the error recovery operation, determining whether a data reliability parameter associated with the set of memory cells meets a data reliability criteria; and
in response to determining that the data reliability criteria is less than a threshold data reliability criteria, setting an offset associated with the error recovery operation as a default read voltage for the set of memory cells.

2. The method of claim 1, further comprising:
determining the data reliability criteria for the set of memory cells by determining a raw bit error rate (RBER) associated with the set of memory cells; and
determining the threshold data reliability criteria by determining a threshold RBER associated with the set of memory cells.

3. The method of claim 1, further comprising performing an auto read calibration operation as part of performing the error recovery operation.

4. The method of claim 1, further comprising:
subsequent to performing the error recovery operation, determining whether the data reliability criteria associated with the set of memory cells is greater than the threshold data reliability criteria; and
incrementing a counter corresponding to performing the error recovery operation.

5. The method of claim 4, further comprising:
determining whether the counter stores a count value that is greater than a threshold count value associated with the threshold data reliability criteria; and
disabling performance of the error recovery operation responsive to the determination that the counter stores the count value that is greater than the threshold count value associated with the threshold data reliability criteria.

6. The method of claim 1, further comprising determining whether the data reliability criteria associated with the set of memory cells is greater than the threshold data reliability criteria, performing the error recovery operation, and setting the offset associated with successfully performing at least the portion of the error recovery sequence as the default read voltage for the set of memory cells within a mobile computing device.

7. An apparatus, comprising:
a set of memory cells; and
an error recovery operation component coupled to the set of memory cells, wherein the error recovery operation component is to:
determine, subsequent to performing an error recovery operation, whether a data reliability parameter value associated with the set of memory cells is less than a threshold data reliability parameter value; and
assign an offset associated with performance of the error recovery operation as a default read voltage for the set of memory cells in response to the determination that the data reliability parameter value is less than the threshold data reliability parameter value.

8. The apparatus of claim 7, wherein the data reliability parameter value comprises a raw bit error rate (RBER) associated with the set of memory cells.

9. The apparatus of claim 7, wherein the apparatus comprises a mobile computing device.

10. The apparatus of claim 7, further comprising a counter coupled to the error recovery operation component, wherein the error recovery operation component is further to:
determine, subsequent to performance of the error recovery operation, whether the data reliability parameter value associated with the set of memory cells is greater than the threshold data reliability parameter value; and
increment the counter in response to a determination that the data reliability parameter value associated with the set of memory cells is greater than the threshold data reliability parameter value.

11. The apparatus of claim 10, wherein the error recovery operation component is to:
determine whether the counter stores a count value that is greater than a threshold count value associated with the threshold data reliability parameter value; and
disable performance of the error recovery operation in response to the counter storing the count value that is greater than the threshold count value.

12. The apparatus of claim 7, wherein the error recovery operation component is to cause performance of a read calibration operation as part of performing the error recovery operation.

13. The apparatus of claim 7, wherein the threshold data reliability parameter value is based on a determined low-density parity-check throughput associated with the set of memory cells.

14. An apparatus, comprising:
a memory device comprising a plurality of NAND memory cells; and
a processing device coupled to the memory device, wherein the processing device is configured to:
perform a read recovery operation in response to a determination that a data reliability criteria associated with the respective set of the NAND memory cells is greater than a threshold data reliability criteria;
determine, subsequent to performing the read recovery operation, whether the data reliability criteria associated with the respective set of the NAND memory cells is less than the threshold data reliability criteria; and
set a voltage associated with an auto read calibration operation as a default read voltage for the respective set of the NAND memory cells in response to the determination that the data reliability criteria is less than the threshold data reliability criteria.

15. The apparatus of claim 14, wherein the processing device is configured to determine a raw bit error rate (RBER) associated with the respective set of the NAND memory cells to determine the data reliability criteria for the respective set of the NAND memory cells.

16. The apparatus of claim 14, wherein the threshold data reliability criteria corresponds to a threshold raw bit error rate (RBER) associated with the respective set of the NAND memory cells.

17. The apparatus of claim 14, wherein the threshold data reliability criteria is based on a determined low-density parity-check throughput associated with the respective set of the NAND memory cells.

18. The apparatus of claim 14, further comprising a counter coupled to the processing device, wherein the processing device is configured to:
determine, subsequent to performance of the error recovery operation, whether the data reliability criteria associated with the set of the NAND memory cells is greater than the threshold data reliability criteria; and
increment the counter in response to a determination that the data reliability criteria associated with the set of the NAND memory cells is greater than the threshold data reliability criteria.

19. The apparatus of claim 18, wherein the processing device is configured to disable performance of the error recovery operation in response to determining that the counter stores a count value that is greater than a threshold count value associated with the threshold data reliability criteria.

20. The apparatus of claim 14, wherein the memory device is resident on a mobile computing device.

* * * * *